(12) United States Patent
Kim et al.

(10) Patent No.: US 8,038,838 B2
(45) Date of Patent: *Oct. 18, 2011

(54) SPIN HEAD, METHOD OF OPERATING THE SPIN HEAD AND APPARATUS FOR TREATING SUBSTRATES WITH THE SPIN HEAD

(75) Inventors: Ju Won Kim, Seoul (KR); Ki Hoon Choi, Cheonan-shi (KR); Jung Keun Cho, Seoul (KR); Kyo Woog Koo, Cheonan-shi (KR); Jung Bong Choi, Seoul (KR)

(73) Assignee: Semes Co., Ltd. (KR)

( * ) Notice: Subject to any disclaimer, the term of this patent is extended or adjusted under 35 U.S.C. 154(b) by 934 days.

This patent is subject to a terminal disclaimer.

(21) Appl. No.: 11/945,342

(22) Filed: Nov. 27, 2007

(65) Prior Publication Data

US 2008/0127888 A1    Jun. 5, 2008

(30) Foreign Application Priority Data

Nov. 28, 2006   (KR) .................... 10-2006-0118076

(51) Int. Cl.
*H01L 21/68* (2006.01)
*H01L 21/027* (2006.01)
(52) U.S. Cl. .................. 156/345.55; 118/730
(58) Field of Classification Search ............ 156/345.55; 118/52, 300, 500, 730; 427/240

See application file for complete search history.

(56) References Cited

U.S. PATENT DOCUMENTS

| 5,989,342 | A | 11/1999 | Ikeda et al. | |
| 7,018,555 | B2 * | 3/2006 | Shimbara et al. | 216/92 |
| 2002/0027138 | A1 | 3/2002 | Hyobu | |
| 2008/0052948 | A1 * | 3/2008 | Kim et al. | 34/317 |
| 2008/0127888 | A1 * | 6/2008 | Kim et al. | 118/52 |

FOREIGN PATENT DOCUMENTS

| JP | 04190548 | 7/1992 |
| JP | 05102203 | 4/1993 |
| JP | 09-148416 | 6/1997 |
| JP | 2004092871 | 3/2004 |
| JP | 2004111902 | 4/2004 |
| JP | 2005-260088 | 9/2005 |
| KR | 97-006206 | 9/1987 |

OTHER PUBLICATIONS

Note: The four (4) Japanese references were cited in a first Office Action issued Apr. 20, 2010 in the corresponding Japanese patent application.

* cited by examiner

*Primary Examiner* — Sylvia R. MacArthur
(74) *Attorney, Agent, or Firm* — Charter IP LLC; Matthew J. Lattig

(57) ABSTRACT

A spin head includes chucking pins configures to chuck and unchuck a substrate. Contact portions of the chucking pins and the substrate are varied during a process to prevent a treating solution from remaining at the contact portions.

8 Claims, 9 Drawing Sheets

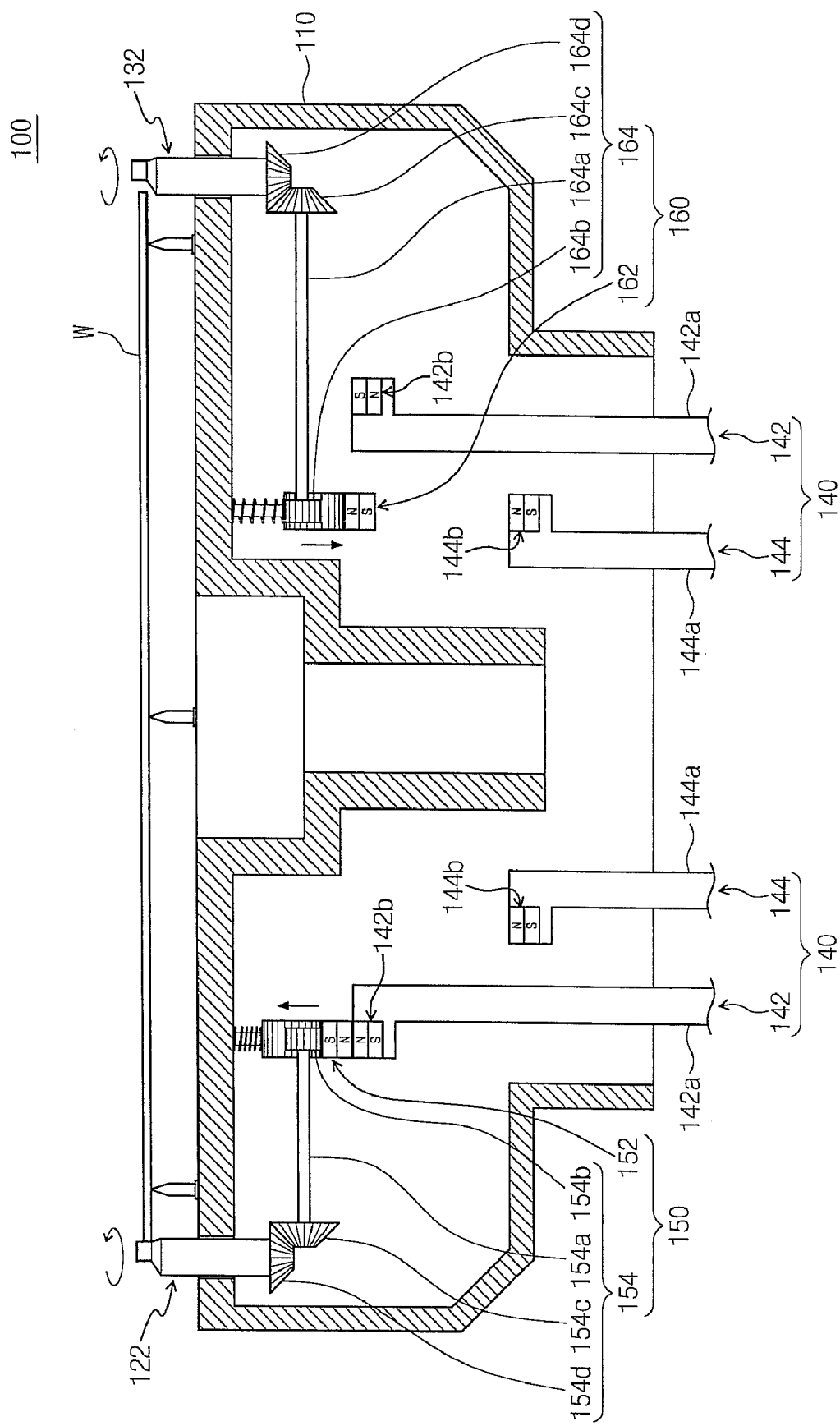

SPIN HEAD, METHOD OF OPERATING THE SPIN HEAD AND APPARATUS FOR TREATING SUBSTRATES WITH THE SPIN HEAD

CROSS-REFERENCE TO RELATED APPLICATIONS

This U.S. non-provisional patent application claims priority under 35 U.S.C §119 of Korean Patent Application 2006-118076 filed on Nov. 28, 2006, the entirety of which is hereby incorporated by reference.

BACKGROUND

The present invention is directed to a spin head provided to hold and spin a substrate during a process, a method of operating the spin head, and an apparatus for treating substrates with the spin head.

A spin cleaner rotates a semiconductor substrate at a predetermined speed and injects a treating solution, such as an cleaning solution or an etching solution, onto the rotated semiconductor substrate to remove foreign substances remaining on a surface of the substrate. A typical spin cleaner includes a housing, a spin head, and an injection member. In the housing, defined is a space where a substrate cleaning process is performed. The housing exhibits the shape of a top-open cup. The spin head is rotatably installed inside the housing to hold and rotate a substrate inside the housing. The injection member injects a treating solution onto a substrate rotated by means of the spin head during a process.

Generally, methods of holding a substrate using a spin head include a method of vacuum-absorbing the treated surface of a substrate to hold the substrate and a method of mechanically holding the edge of a substrate. In the mechanical holding method, means for partially chucking and unchucking the edge of a substrate is provided to hold the substrate on a spin head. The means may be a plurality of chucking pins. However, when a substrate is chucked by chucking pins during a process, the chucking pins continue to come in contact with one portion of the substrate until a substrate treating process is completed. Therefore, treating solutions used in the process remain at the portion where the chucking pins are in contact with the substrate. The remaining treating solutions are hardened or act as debris after the process and contaminate a substrate and the periphery of a system to degrade process efficiency.

SUMMARY OF THE INVENTION

Exemplary embodiments of the present invention are directed to spin head for holding and rotating a substrate during a process. In an exemplary embodiment, the spin head may include: a rotatable body; chucking/unchucking means disposed to be ring-shaped around the center of a top surface of the body and including a plurality of chucking pins provided to partially chuck and unchuck the edge of the substrate during a process; and a driving unit for rotating the chucking pins at a predetermined angle to selectively vary portions where the respective chucking pins are in contact with the substrate, wherein the driving unit comprises: a lifting member movable up and down; and a movement conversion member configured to convert up-down movement of the lift member to rotation movement of the chucking pins.

Exemplary embodiments of the present invention are directed to an apparatus for treating substrates. In an exemplary embodiment, the apparatus may include: a housing in which defined is a space where a substrate treating process is performed; a spin head configured to hold and rotate a substrate in the space of the housing during a process; and an injection member configured to inject a treating solution to a substrate rotated by the spin head, wherein the spin head comprises: a rotatable body; chucking/unchucking means disposed to be ring-shaped around the center of a top surface of the body and including a plurality of chucking pins provided to partially chuck and unchuck the edge of the substrate during a process; and a driving unit including a lifting member movable up and down and a movement conversion member configured to convert the up-down movement of the lifting member to rotation movement of the chucking pins and selectively varying portions where the respective chucking pins are in contact with the substrate during a process.

Exemplary embodiments of the present invention are directed to a method for operating a spin head. In an exemplary embodiment, the method may include: loading a substrate on a body having a top surface on which first and second chucking pins are disposed; chucking the substrate by means of the first chucking pin for a first process time, and performing a process for the substrate while rotating the body; and chucking the substrate by means of the second chucking pin for a second process time, and performing a process for the substrate while rotating the body.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete and will fully convey the scope of the invention to those skilled in the art. Like numbers refer to like elements throughout.

Figure 1:
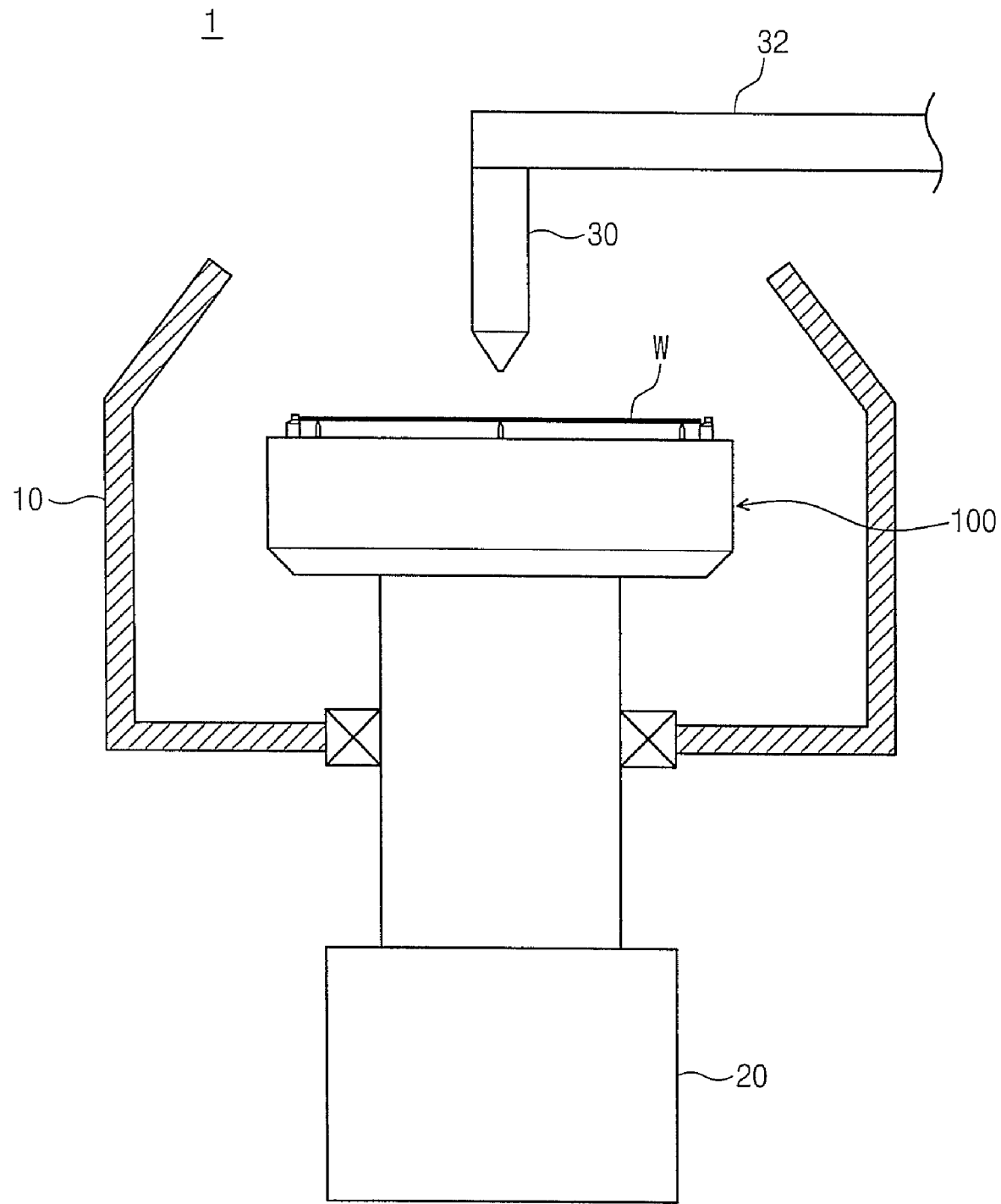
FIG. 1 is a configuration diagram of a substrate treating apparatus according to the present invention.

FIG. 1 illustrates a substrate treating apparatus 1 according to the present invention. Referring to FIG. 1, the substrate treating apparatus 1 includes a housing 10, a driving member 20, an injection member 30, and a spin head 100. In the housing 10, defined is a space where a substrate treating process is performed. The substrate treating process is a process to remove foreign substances remaining on a substrate by using a treating solution such as a cleaning solution or an etching solution. A top of the housing 10 is partially opened. The partially opened top of the housing 10 is used as a substrate entrance through which a substrate W enters or exits.

The driving member 20 rotates the spin head 100 inside the housing 10 during a process. Also the driving member 20 lifts the spin head 100 up and down when a substrate W is loaded/unloaded. The injection member 30 injects a treating fluid to a substrate W during a process. The treating fluid includes various kinds of treating solutions and/or treating gases. The treating solution is a cleaning solution or an etching solution, and the treating gas is isopropyl alcohol (IPA) gas or nitrogen ($N_2$) gas. The injection member 30 includes at least one nozzle and transportation means for transporting the nozzle.

Figure 2:
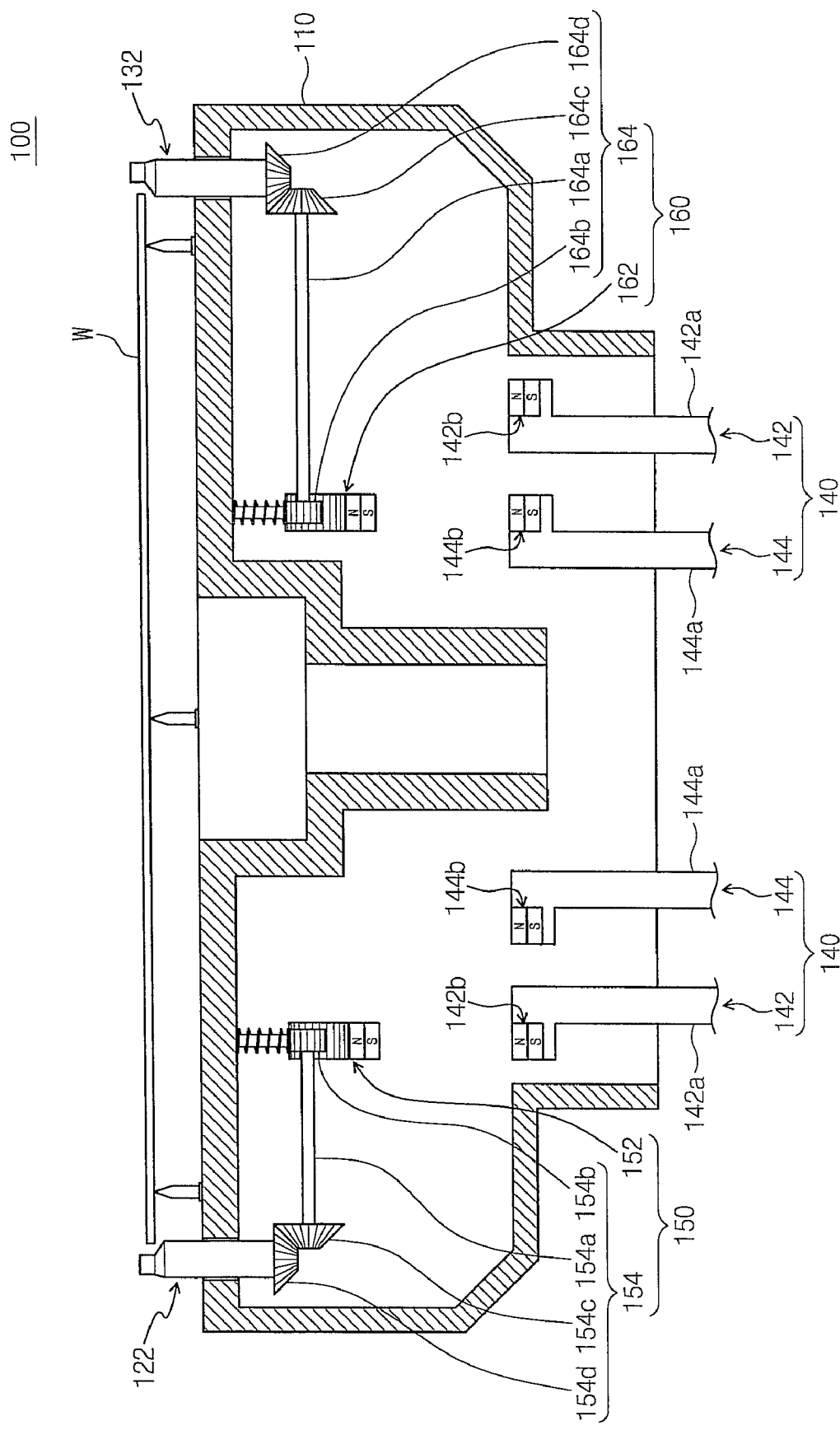
FIG. 2 is a configuration diagram of a spin head shown in FIG. 1.
Figure 3:
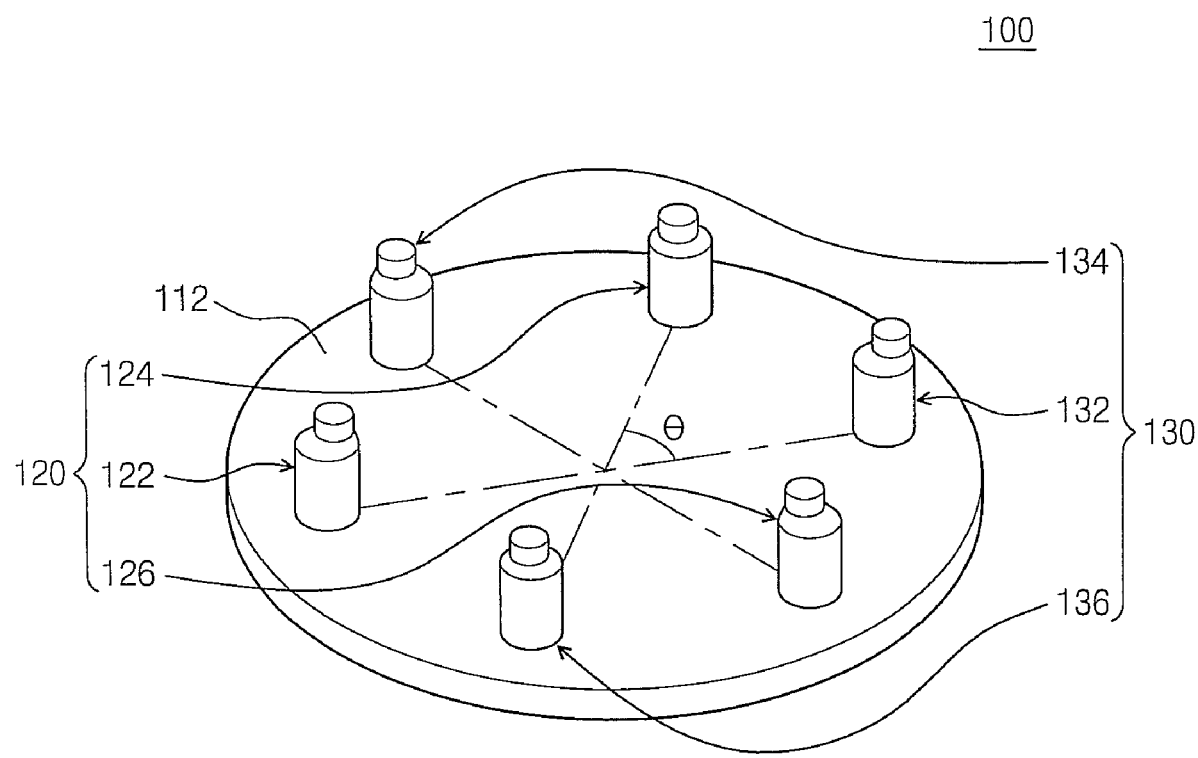
FIG. 3 is a perspective view of a support plate and chucking pins of the spin head shown in FIG. 2.
Figure 4:
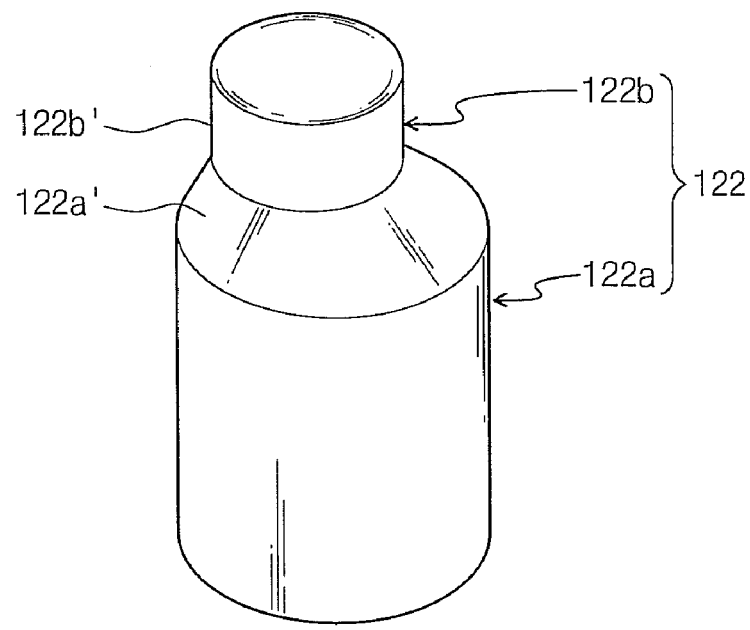
FIG. 4 is an enlarged view of the chucking pin shown in FIG. 3.
Figure 5:
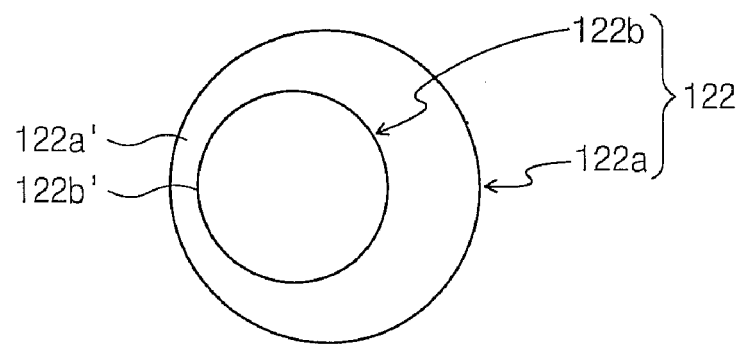
FIG. 5 is a top plan view of the chucking pin shown in FIG. 4.
Figure 6:
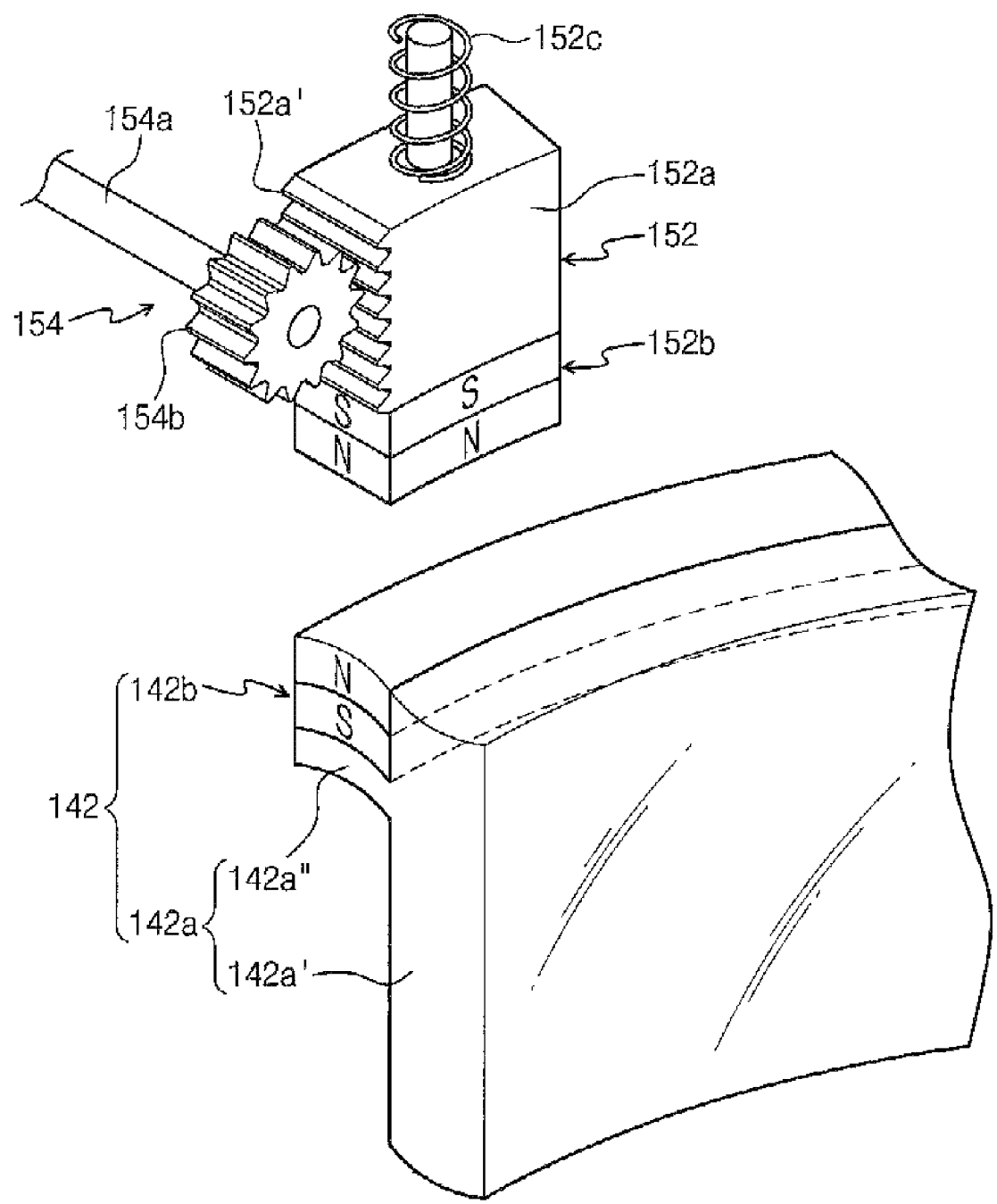
FIG. 6 is a perspective view of a concave portion of a movement conversion member shown in FIG. 2.

The configuration of the spin head 100 will now be described in detail below. FIG. 2 is a configuration diagram of a spin head shown in FIG. 1, and FIG. 3 is a perspective view of a support plate and chucking pins of the spin head shown in FIG. 2. FIG. 4 is an enlarged view of the chucking pin shown in FIG. 3, and FIG. 5 is a top plan view of the chucking pin shown in FIG. 4. FIG. 6 is a perspective view of a concave portion of a movement conversion member shown in FIG. 2.

Referring to FIGS. 2 and 3, the spin head 100 according to the present invention includes a body 110, chucking/unchucking means 120 and 130, and a driving unit. The body 110 roughly exhibits a cylindrical shape and includes a support plate 112. The support plate 112 is provided on the body 110 to support and rotate a substrate W. The support plate 112 rotates at a predetermined speed during a process. Holes are formed at the support plate 112. Chucking pins 120 and 130, which will be described later, are inserted into the holes.

Chucking/unchucking means are configured for chucking and unchucking a substrate W during a process. The chucking/unchucking means include a first chucking member 120 and a second chucking member 130. Each of the first and second chucking means 120 and 130 includes a plurality of chucking pins. In an embodiment, the chucking/unchucking means include six chucking pins. The chucking pins are grouped into the first chucking member 120 including three chucking pins 122, 124, and 126 and the second chucking member 130 including three chucking pins 132, 134, and 136. Specifically, the first chucking member 120 includes first pins 122, 124, and 126 in the chucking pins and the second chucking member 130 includes second pins 132, 134, and 136 in the chucking pins. The first and second pins 122, 124, 126, 132, 134, and 136 are disposed on the edge of the support plate 122 at same angle θ, around the center of the support plate 112 of the body 100. In the present embodiment, the angle θ is about 60 degrees. The first pins 122, 124, and 126 and the second pins 132, 134, and 136 are alternately installed with the same distance from the center of a top surface of the body 100.

Each of the chucking pins comes in contact with a side surface of a substrate W to hold the substrate W during a process. Since the configurations of the chucking pins 122, 124, 126, 132, 134, and 136 are identical to each other, only the configuration of the chucking pin 122 will be described in this embodiment. Referring to FIGS. 4 and 5, the chucking pin 122 includes a first body 122a and a second body 122b. Each of the first and second bodies 122a and 122b exhibits the shape of a vertically long cylinder. The first body 122a is inserted into holes formed at a support plate 112 and installed over the support plate 112 to be rotatable at a predetermined angle. The second body 122b perpendicularly extends from a top surface of the first body 122a. The second body 122b has a smaller diameter than a diameter of the first body 122a. As illustrated in FIG. 5, the second body 122b is formed to depart from the center of the top surface of the first body 122a. For this reason, the rotation of the first body 122a forces the second body 122b to comes close to or go away from the center of the support plate 112. An inclined surface 122a' is provided between the first and second bodies 122a and 122b.

The inclined surface 122a' is a surface inclined to the second body 122b from the first body 122a. An edge side surface of a substrate W is placed on the inclined surface 122a' during a process. The rotation of the chucking pin 122 forces the substrate W to be slidably elevated. The elevated substrate W is fixed by a side surface 122b' of the second body 122b.

It is described in this embodiment that each chucking pin includes a first body and a second body and an inclined surface is provided between the first and second bodies to allow a substrate W to be slid therealong. However, a chucking pin for supporting and fixing a substrate W may have a variety of configurations. While the configurations of chucking pins 122, 124, 126, 132, 134, and 136 are identical to each other in this embodiment, they may be optionally different from each other.

Returning to FIG. 2, the foregoing chuck pins 122, 124, 126, 132, 134, and 135 are driven by a driving unit. The driving unit includes a lifting member 140 and a movement conversion member. The lifting member 140 includes a first driving member 142 and a second driving member 144. The first driving member 142 drives first pins 122, 124, and 126. The first driving member 142 includes a first elevating body 142a and a first magnet 142b. The first elevating body 142a includes a plurality of elevating rods 142a' and a ring-shaped elevating ring 142a". The elevating ring 142a" is horizontally installed inside the body 110 of the spin head 100 and is held and elevated by the elevating rod 142a'. A top surface of the elevating ring 142a" is opposite to respective first rack-gear members 152 which will be described later. The first magnet 142b is installed at the elevating ring 142a" to face a second rack-gear member 154 which will be described later. Along the elevating ring 142a", the first magnet 142b is provided to be ring-shaped. Alternatively, a plurality of first magnets 142b may be provided only at an opposite portion of the second rack-gear member 154.

The second driving member 144 drives the second pins 132, 134, and 136. The second driving member 144 has the same configuration approximately as the first driving member 142. That is, the second driving member 144 includes a second elevating body 144a and a second magnet 144b. An elevating ring 144a" of the second elevating body 144a has a smaller diameter than the elevating ring 142a" of the first driving member 142. Thus, the elevating ring 144a" of the second elevating body 144a is elevated or lowered at the inner side of the elevating ring 142a" of the first driving member 142 during a process. The second magnet 144b is disposed at a portion of the elevating ring 144a" to face the second rack-gear member 154 which will be described later.

The movement conversion member includes a first conversion member 150 and a second conversion member 160. The first driving member 142 allows the first rack-gear member 152 to be elevated or lowered. Referring to FIG. 6, the first rack-gear member 152 includes a gear body 152a, a magnet 152b, and a spring 152c. The gear body 152a has one side surface where a screw thread 152a' is formed. The magnet 152b is disposed underneath the gear body 152a to be opposite to the first magnet 142b of the first driving member 142. The first magnet 142b and the magnet 152b are installed to generate a repulsive force therebetween. That is, facing surfaces of the first magnet 142b and the magnet 152b have the same polarity. The spring 152c is provided on the gear body 152a to pressurize the gear body 152c downwardly. Thus, when the first magnet 142b comes close to the magnet 152b to generate a repulsive force, the gear body 152a is elevated. Thereafter when the first magnet 142b goes away from the magnet 152b, the spring 152c is lowered to an original position.

The first conversion member 154 includes a shaft 154a, a spur gear 154b, and first and second bevel gears 154c and 154d. The shaft 154a is installed in a direction that is perpendicular to an up-down direction of the spur gear 154b. The spur gear 154b is installed at one end of the shaft 154a, and the first bevel gear 154c is installed at the other end thereof. The second bevel gear 154d is installed at the lower end of the chucking pins 122, 124, and 126. The spur gear 154b rotates while gearing with the screw thread of the first rack-gear member 152, and the first bevel gear 154c rotates while gearing with the second bevel gear 154d.

The second conversion member 160 has the same configurations approximately as the first conversion member 150. That is, the second conversion member 160 includes a second rack-gear member 162 having the same configuration as the first rack-gear member 152 and a second conversion member 164 having the same configuration as the first conversion member 154. The second rack-gear member 162 includes a gear body 162a, a magnet 162b, and a spring 162c. The second conversion member 164 includes a shaft 164a, a spur gear 164b, and first and second bevel gears 164c and 164d. The second driving member 144 allows the second rack-gear member 162 to be elevated or lowered. The second rack-gear member 162 is installed at an inner side than a position where the first rack-gear member 152 is installed, on the basis of the center of a support plate 112. For this reason, the shaft 164a of the second conversion member 164 is longer than the shaft 164a of the first conversion member 154.

The process steps of the above-described substrate treating apparatus 1 will now be described in detail below. The same elements are designated by the same numerals and will not be described in further detail.

FIGS. 7A and 7B and FIGS. 8A and 8B are diagrams illustrating the operation steps of a spin head according to the present invention. When a substrate treating process starts, a substrate W is loaded on chucking pins of a spin head 100. At this point, the edge of the substrate W is in contact with inclined surfaces provided at chucking pins 122, 124, 126, 132, 134, and 136.

Figure 7B:
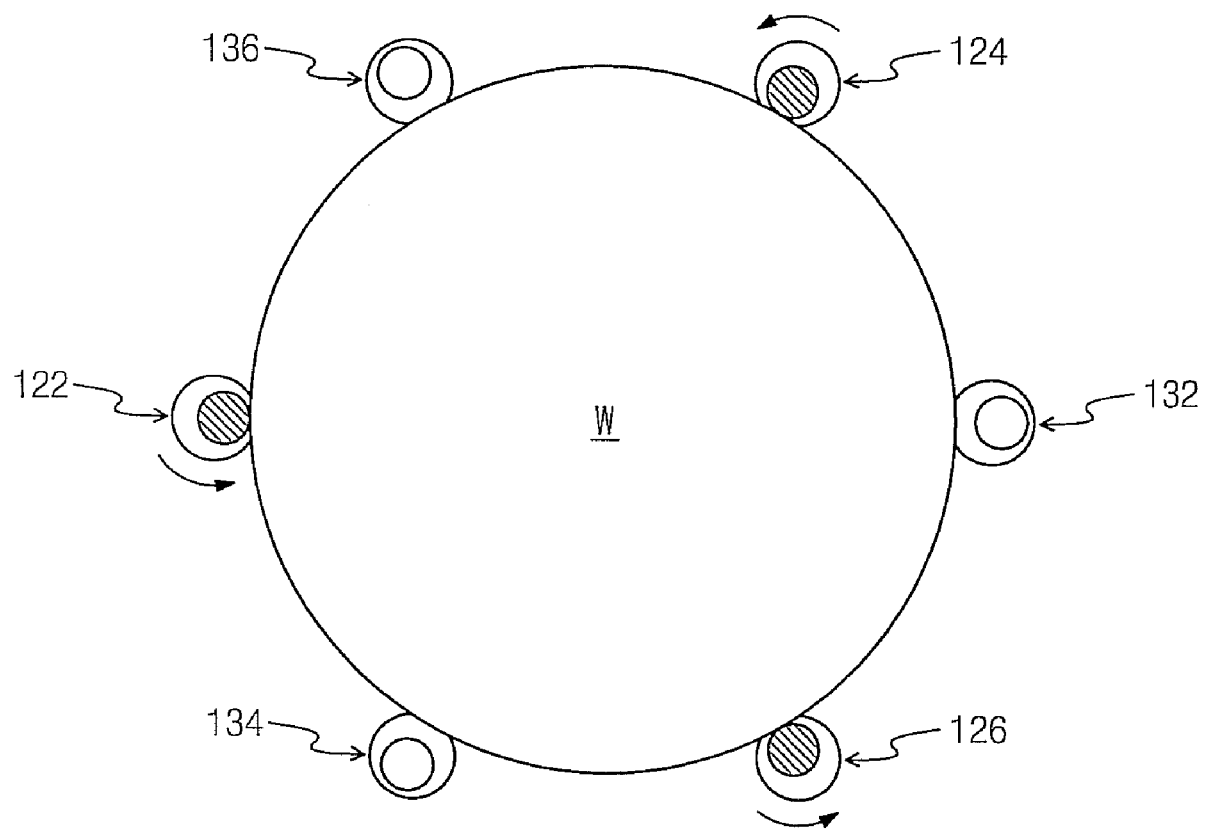
FIGS. 7A through 8B are diagrams illustrating the operation of a spin head according to the present invention.
Figure 8A:
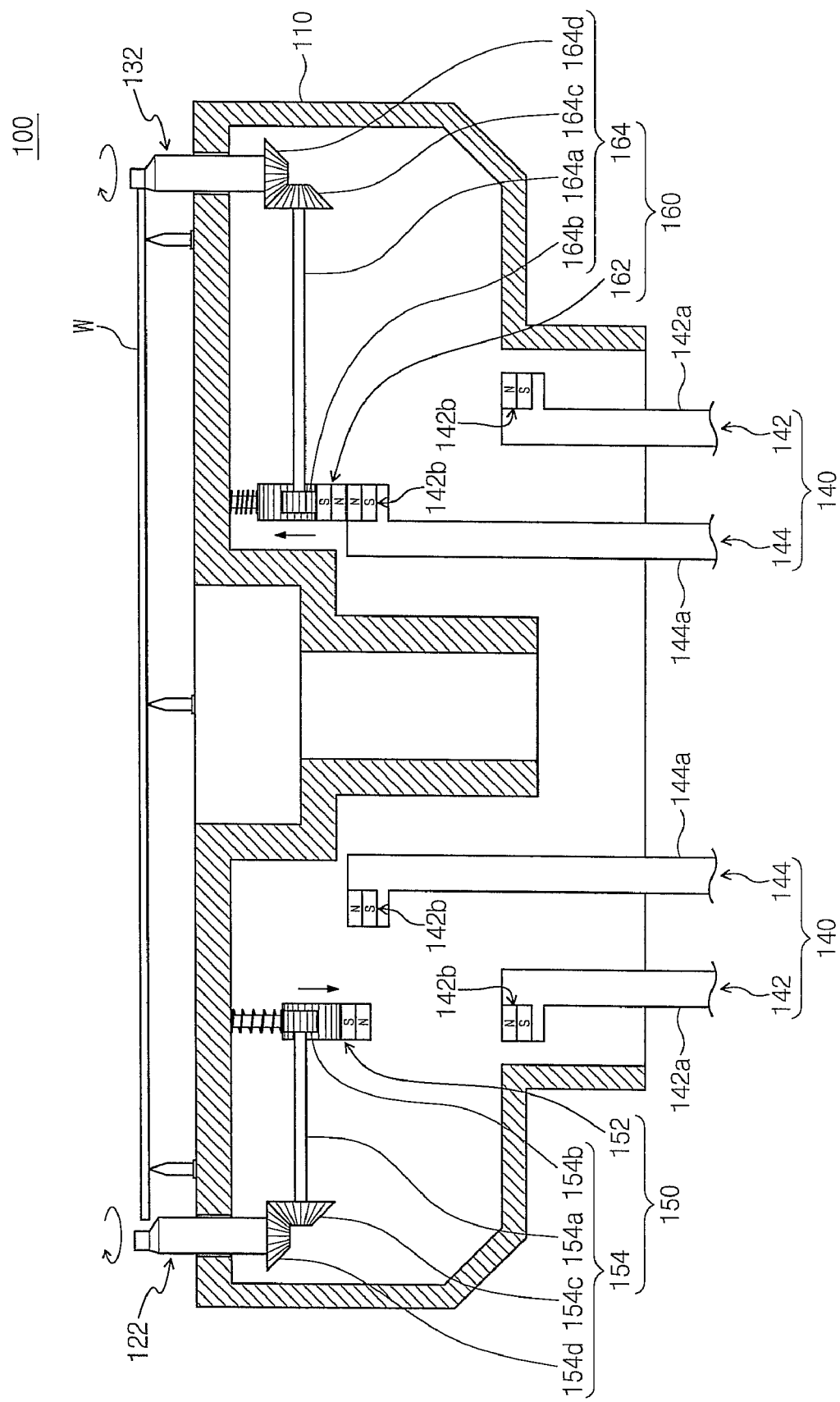
Figure 8B:
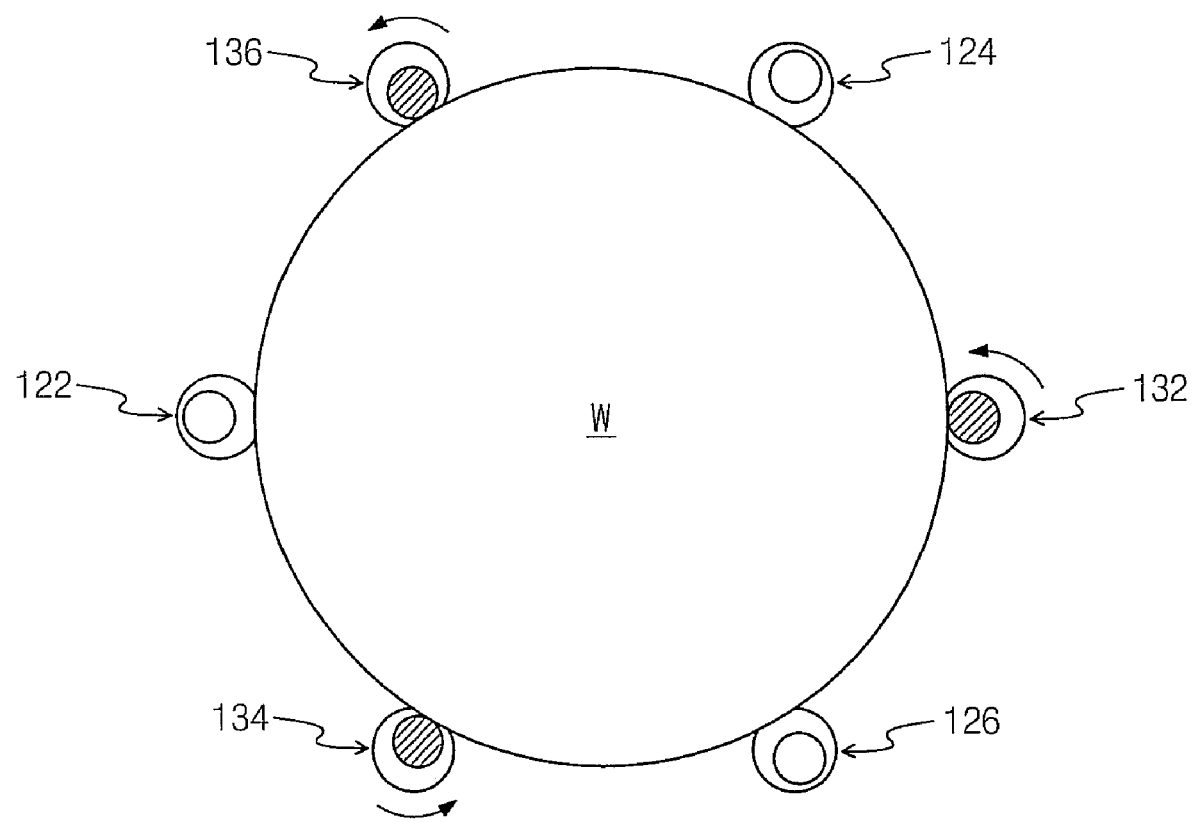

When the substrate W is loaded on the chucking pins 122, 124, 126, 132, 134, and 136, first pins 122, 124, and 126 rotate at a predetermined angle to chuck the substrate W. That is, as illustrated in FIGS. 7A and 7B, a driving unit elevates a first driving member 142 of a lifting member 140. That is, the driving unit elevates a first elevating rod 142a' of the first driving member 142 to allow a first magnet 142b installed at a first elevating ring 142a" to come close to a magnet 152b of a first rack-gear member 152. When the first magnet 142b comes close to the magnet 152b, a repulsive force is generated between the first magnet 142b and the magnet 152b to elevate a gear body 152a to a predetermined height. When the rack-gear body 152a is elevated, a spur gear 154b of a conversion member 154 rotates while gearing with a screw thread 152a formed at the rack-gear body 152a. Due to the rotation of the spur gear 154b, a first bevel gear 154c installed at the other end of a shaft 154a rotates to make a second bevel gear 154d rotate at a predetermined angle. When the first pins 122, 124, and 126 rotate, respective second bodies 122b, 124b, and 126b of the first pins 122, 124, and 126 rotate at a predetermined angle and are folded toward the center of a support plate 112 to come in contact with a side surface of the edge of the substrate W. Thus, the substrate W is fixed by side surfaces 122b', 124b', and 126b' of the first pins 122, 124, and 126.

When the substrate W is chucked, a driving member 20 rotates the spin head 100 at a process speed and an injection member 30 injects a treating solution onto the rotating substrate W. The injected treating solution cleans foreign substances remaining on the surface of the substrate W. While the foregoing process is performed, a first chucking member 120 and a second chucking member 130 chuck the substrate W by turns. That is, when the treating process is performed after the first chucking member 120 chucks the substrate W, the first chucking member 120 unchucks the substrate W with the lapse of a predetermined time and the second chucking member 130 chucks the substrate W. That is, referring to FIGS. 8A and 8B, a driving unit pulls down a first driving member 142 of a lifting member 140 to unchuck the chucked substrate W. Also the driving unit elevates a second elevating rod 144a' of a second driving member 144 to make a second magnet 144b installed at a second elevating ring 144a" come close to a magnet 162b of a second rack-gear member 162. When the second magnet 144b comes close to the magnet 162b of the second rack-gear member 162, a repulsive force is generated between the second magnet 144b and the magnet 162b to elevate a gear body 162a of the second rack-gear member 162 to a predetermined height. When the gear body 162a is elevated, a spur gear 164b of a conversion member 164 rotates while gearing with a screw thread 162a' formed at a rack-gear body 162a. Due to the rotation of the spur gear 164b, a first bevel gear 164c installed at the other end of a shaft 164a rotates to make a second bevel gear 164d rotate at a predetermined angle. When the second pins 132, 134, and 136 rotate, respective second bodies 132b, 134b, and 136b of the first pins 132, 134, and 136 rotate at a predetermined angle and are folded toward the center of a support plate 112 to come in contact with a side surface of the edge of the substrate W. Thus, the substrate W is fixed by side surfaces 132b', 134b', and 136b' of the first pins 132, 134, and 136. The chucking and unchucking of a substrate W are alternately conducted by the first chucking member 120 and the second chucking member 130. The chucking/unchucking steps conducted by the chucking/unchucking means are repeated while a substrate treating process is performed.

When the cleaning of the substrate W is completed, an injection member 30 injects dry gas to the substrate W to dry the substrate W. The dry gas may be isopropyl (IPA) gas. Even while a dry process for a substrate W is performed, the first chucking member 120 and the second chucking member 130 chuck and unchuck the substrate W by turns. When the dry process for a substrate W is completed, the driving member 20 elevates the spin head 100, after stopping the rotation of the spin head 100, to transport the substrate W loaded on the spin head 100 to the outside of a housing 10 through an open top of the housing 100. When the substrate W is exposed to the outside of the housing 10, chucking/unchucking means unchucks the substrate W and a robot (not shown) transfers the substrate W to the site where a subsequent process is to be performed.

According to the foregoing spin head 100, the substrate chucking/unchucking method of the spin head 100, and the substrate treating apparatus 1 including the spin head 100, a first chucking member 120 and a second chucking member 130 chuck and unchuck a substrate W by turns to vary a portion where respective chucking pins are in contact with the substrate W. Therefore, it is possible to prevent a treating solution from remaining at portions where the substrate W is chucked.

According to the foregoing driving unit, a movement conversion member converts the up-down linear movement of a lifting member 140 to the rotation movement of chucking pins. Especially, magnets 142b and 144b installed at the lifting member 140 and magnets 152b and 154b installed at rack-gear members 152 and 162 vertically face each other to generate a repulsive force. The above-described configuration of the driving unit may cause a repulsive force generated between magnets 142b and 144b and magnets 152b and 162b to be stronger than at a conventional configuration where the magnets 142b and 144b and the magnets 152b and 162b travel horizontally and a repulsive force is generated between the magnets 152b and 162b as the magnets 142b and 144b travel horizontally. Thus, the spin head for driving chucking pins enables a stronger repulsive force to be generated between magnets.

As explained so far, substrate chucking/unchucking means chucks and unchucks the edge of a substrate by turns during a process to prevent a treating solution from remaining on the surface of the substrate. Thus, it is possible to suppress a process efficiency degradation caused by a treating solution remaining on the surface of a substrate.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A spin head for holding and rotating a substrate during a process, the spin head comprising:
   a rotatable body;
   chucking/unchucking means disposed to be ring-shaped around the center of a top surface of the body and including a plurality of chucking pins provided to partially chuck and unchuck the edge of the substrate during a process; and
   a driving unit for rotating the chucking pins at a predetermined angle to selectively vary portions where the respective chucking pins are in contact with the substrate,
   wherein the driving unit comprises:
      a lifting member movable up and down, the lifting member including an elevating ring having a substantially ring shape and forming an upper end of an elevating rod configured to elevate the elevating ring or lower the elevating ring, the elevating ring and elevating rod thereby forming a single integral body, the elevating ring of the integral body further including a magnet formed into a top surface portion of the elevating ring; and
      a movement conversion member configured to convert up-down movement of the lifting member to rotation movement of the chucking pins, the movement conversion member including a rack-gear member having a gear body with a magnet affixed directly to its body lower end so as to be in facing relation with the magnet formed in the top surface portion of the elevating ring, the elevating ring directly below the gear body and movable up and down in a vertical plane to generate a repulsive force between the facing magnets, the repulsive force making the rack-gear member move up and down.

2. The spin head of claim 1,
   wherein the movement conversion member further includes:
      a conversion member configured to convert the up-down movement of the rack-gear member to the rotation movement of the chucking pins.

3. The spin head of claim 2, wherein the conversion member comprises:
   a shaft installed in a direction that is perpendicular to an up-down movement direction of the rack-gear member;
   a first spur gear installed at one end of the shaft to rotate while gearing with the rack gear;
   a first bevel gear installed at the other end of the shaft; and
   a second bevel gear installed at the lower end of the chucking pins to rotate while gearing with the first bevel gear.

4. The spin head of claim 3, wherein the chucking pins comprise:
   first pins arranged around the center of the substrate at regular angles to support edges of the substrate; and
   second pins arranged around the center of the substrate at regular angles to support different portions of the substrate from the portions held by the first pins,
   wherein the lifting member comprises:
   a first driving member configured to rotate the first pins; and
   a second driving member configured to rotate the second pins and installed at inner side of the first driving member, and
   wherein the driving unit elevates or lower an elevating rod provided at the first driving member and an elevating rod provided at the second driving member by turns during a process.

5. An apparatus for treating substrates, comprising:
   a housing in which defined is a space where a substrate treating process is performed;
   a spin head configured to hold and rotate a substrate in the space of the housing during a process; and
   an injection member configured to inject a treating solution to a substrate rotated by the spin head,
   wherein the spin head comprises:
      a rotatable body;
      chucking/unchucking means disposed to be ring-shaped around the center of a top surface of the body and including a plurality of chucking pins provided to partially chuck and unchuck the edge of the substrate during a process; and
      a driving unit including a lifting member movable up and down and a movement conversion member configured to convert the up-down movement of the lifting member to rotation movement of the chucking pins, the driving unit including a lifting member selectively varying portions where the respective chucking pins are in contact with the substrate during a process,
      wherein the lifting member further includes an elevating ring having a substantially ring shape and forming an upper end of an elevating rod configured to elevate the elevating ring or lower the elevating ring, the elevating ring and elevating rod thereby forming a single integral body, the elevating ring of the integral body further including a magnet formed into a top surface portion of the elevating ring; and
      wherein the movement conversion member further includes a rack-gear member having a gear body with a magnet affixed directly to its body lower end so as to be in facing relation with the magnet formed in the top surface portion of the elevating ring, the elevating ring directly below the gear body and movable up and down in a vertical plane to generate a repulsive force between the facing magnets, the repulsive force making the rack-gear member move up and down.

6. The apparatus of claim 5,
   wherein the movement conversion member includes:
      a conversion member configured to convert the up-down movement of the rack-gear member to the rotation movement of the chucking pins.

7. The apparatus of claim 6, wherein the conversion member comprises:

a shaft installed in a direction that is perpendicular to an up-down movement direction of the rack-gear member;

a first spur gear installed at one end of the shaft to rotate while gearing with the rack gear;

a first bevel gear installed at the other end of the shaft; and a second bevel gear installed at the lower end of the chucking pins to rotate while gearing with the first bevel gear.

8. The apparatus of claim 7, wherein the chucking pins comprise:

first pins arranged around the center of the substrate at regular angles to hold edges of the substrate; and second pins arranged around the center of the substrate at regular angles to hold different portions of the substrate from the portions held by the first pins, wherein the lifting member comprises:

a first driving member configured to rotate the first pins; and a second driving member configured to rotate the second pins and installed at inner side of the first driving member, and wherein the driving unit elevates or lower an elevating rod provided at the first driving member and an elevating rod provided at the second driving member by turns during a process.

* * * * *